United States Patent

Narwal et al.

(10) Patent No.: US 10,886,931 B1
(45) Date of Patent: Jan. 5, 2021

(54) CIRCUITRY FOR LOW INPUT CHARGE ANALOG TO DIGITAL CONVERSION

(71) Applicant: STMicroelectronics International N.V., Geneva (CH)

(72) Inventors: Rajesh Narwal, Greater Noida (IN); Kavindu Shekhar Benjwal, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/937,955

(22) Filed: Jul. 24, 2020

Related U.S. Application Data

(63) Continuation of application No. 16/560,683, filed on Sep. 4, 2019, now Pat. No. 10,771,082.

(51) Int. Cl.
*H03M 1/00* (2006.01)
*H03M 1/12* (2006.01)
*H03K 3/037* (2006.01)
*H03K 19/20* (2006.01)

(52) U.S. Cl.
CPC .......... *H03M 1/1245* (2013.01); *H03K 3/037* (2013.01); *H03M 1/122* (2013.01); *H03K 19/20* (2013.01)

(58) Field of Classification Search
CPC .............................. H03M 1/1245; H03M 1/22

USPC ......................................... 341/155, 141, 122
See application file for complete search history.

(56) References Cited

U.S. PATENT DOCUMENTS

| | | | |
|---|---|---|---|
| 3,448,446 A | 6/1969 | James et al. | |
| 5,748,134 A | 5/1998 | Dent | |
| 7,385,440 B2 * | 6/2008 | Aksin | H03K 17/063 327/390 |
| 8,289,198 B2 * | 10/2012 | Agarwal | H03M 1/002 341/172 |
| 10,078,134 B2 * | 9/2018 | Patukuri | G01S 7/4865 |
| 2016/0091572 A1 | 3/2016 | Fujii | |
| 2016/0100116 A1 | 4/2016 | Mesgarini | |
| 2019/0148701 A1 | 5/2019 | Ashrajzadeh | |
| 2020/0083896 A1 | 3/2020 | Mostafanezhad et al. | |

* cited by examiner

*Primary Examiner* — Peguy Jean Pierre
(74) *Attorney, Agent, or Firm* — Crowe & Dunlevy

(57) ABSTRACT

A circuit includes analog input nodes and switches selectively coupling each of the analog input nodes to a capacitive node. Each of the switches is controlled by a respective bit of a channel selection word. Level shifting circuits are respectively coupled in parallel with the switches. A sampling capacitor is coupled between an output node and ground, the output node being coupled to the capacitive node. An analog to digital converter operates to digitize voltages at the output node.

20 Claims, 13 Drawing Sheets

US 10,886,931 B1

CIRCUITRY FOR LOW INPUT CHARGE ANALOG TO DIGITAL CONVERSION

RELATED APPLICATION

This application is a continuation of U.S. patent application Ser. No. 16/560,683, filed Sep. 4, 2019, the contents of which are incorporated by reference in their entirety to the maximum extent allowable under the law.

TECHNICAL FIELD

This disclosure is related to the field of analog to digital conversion and, in particular, to a circuit for reducing the input charge provided from an analog input to a sampling capacitor of an analog to digital converter.

BACKGROUND

Analog to digital conversion is widely used in applications involving numerous sensors, such as automotive applications. In some conventional forms of analog to digital conversion, an analog source (such as a sensor) provides an input charge to a sampling capacitor, and the charge accumulated, hence the voltage sampled on the sampling capacitor over a sampling period is converted to a digital value.

It is desired to reduce the input charge so that voltage drop across an input filter of the analog to digital converter is reduced, enabling an increase in sampling rate. Existing technology accomplishes this goal using rail to rail buffers to sample the input voltage. While this eliminates the concern about input charge, such buffers consume a large amount of on-chip area and have high power consumption, particularly with a high sampling rate. Particularly for cases where there are numerous analog input sources, the use of such buffers becomes too costly in terms of area and power consumption.

Therefore, further development in this area is needed.

SUMMARY

One aspect disclosed herein is directed to an input circuit for a multiplexer. The input circuit includes a first analog input node, an output node, and a capacitive node connected to the output node. A first control circuit is configured to set a charge at the capacitive node to a desired voltage, during a first period of time beginning in response to a start of a sampling cycle of an analog to digital converter where input to the analog to digital converter is driven by output from the multiplexer. A second control circuit is configured to set a charge at the capacitive node to a voltage at the first analog input node modified by a mismatch voltage resulting from mismatch in threshold voltages between a first transistor connected to the first analog input node and a second transistor connected to the output node, during a second period of time beginning in response to expiration of the first period of time. A first channel selection switch closes to connect the first analog input node to the output node to thereby charge the capacitive node to the voltage at the first analog input node, the first channel selection switch being closed in response to expiration of the second period of time. The first channel selection switch opens to disconnect the first analog input node from the output node at an end of the sampling cycle of the analog to digital converter.

Another aspect disclosed herein is directed to an input circuit for an analog to digital converter. The input circuit includes a first channel selection switch that closes to connect a first analog input node to an intermediate node to thereby charge the intermediate node to a voltage at the first analog input node, the first channel selection switch being closed during a first period of time beginning in response to a start of a sampling cycle of the analog to digital converter. A capacitive node is connected to an output node. Discharge circuitry is connected between the first channel selection switch and the output node and configured to discharge the capacitive node during the first period of time. Level shifting circuitry is configured to charge the capacitive node to a voltage at the intermediate node less a threshold voltage of a first transistor of the level shifting circuitry, during a second period of time beginning in response to expiration of the first period of time. A selection switch closes to connect the intermediate node to the output node to thereby charge the output node to the voltage at the intermediate node, the selection switch being closed in response to expiration of the second period of time. The selection switch opens to disconnect the intermediate node from the output node at an end of the sampling cycle of the analog to digital converter.

A further aspect disclosed herein is directed to an input circuit for an analog to digital converter. The input circuit includes a first channel selection switch that closes to connect a first analog input node to an intermediate node to thereby charge the intermediate node to a voltage at the first analog input node, the first channel selection switch being closed during a first period of time beginning in response to a start of a sampling cycle of the analog to digital converter. A capacitive node is connected to an output node. Charge circuitry is connected between the first channel selection switch and the output node and configured to charge the capacitive node to a supply voltage during the first period of time. Level shifting circuitry is configured to discharge the capacitive node to a voltage at the intermediate node plus a threshold voltage of a first transistor of the level shifting circuitry, during a second period of time beginning in response to expiration of the first period of time. A selection switch closes to connect the intermediate node to the output node to thereby discharge the output node to the voltage at the intermediate node, the selection switch being closed in response to expiration of the second period of time. The selection switch opens to disconnect the intermediate node from the output node at an end of the sampling cycle of the analog to digital converter.

An additional aspect is directed to an input circuit for an analog to digital converter. The input circuit includes a first channel selection switch that closes to connect a first analog input node to an intermediate node to thereby charge the intermediate node to a voltage at the first analog input node, the first channel selection switch being closed during a first period of time beginning in response to a start of a sampling cycle of the analog to digital converter. A capacitive node is connected to an output node. A first control circuit is connected between the first channel selection switch and the output node and configured to set a charge at the capacitive node to a desired voltage during the first period of time. A second control circuit is configured to set a charge at the capacitive node to a voltage at the intermediate node modified by a mismatch voltage resulting from mismatch in threshold voltages between a first transistor connected to the intermediate node and a second transistor connected to the output node, during a second period of time beginning in response to expiration of the first period of time. A selection switch closes to connect the intermediate node to the output node to thereby charge the output node to the voltage at the intermediate node, the selection switch being closed in response to expiration of the second period of time. The selection switch opens to disconnect the intermediate node from the output node at an end of the sampling cycle of the analog to digital converter.

Another aspect is directed to a circuit including a plurality of analog input nodes, and a plurality of switches selectively coupling each of the plurality of analog input nodes to a capacitive node, each of the plurality of switches controlled by a respective bit of a channel selection word. A plurality of level shifting circuits are respectively coupled in parallel with the plurality of switches. A sampling capacitor is coupled between an output node and ground, the output node being coupled to the capacitive node. An analog to digital converter digitizes voltages on at the output node.

A further aspect disclosed herein is a circuit with a plurality of analog input nodes, and a plurality of switches selectively coupling each of the plurality of analog input nodes to a first node, each of the plurality of switches controlled by a respective bit of a channel selection word. A switch selectively couples the first node to a capacitive node, the switch controlled by a channel selection signal. A level shifting circuit is coupled to the capacitive node, a supply voltage, and ground, the level shifting circuit being controlled by a voltage at the first node, a first control signal, and a second control signal. A sampling capacitor is coupled between an output node and ground, the output node being coupled to the capacitive node. An analog to digital converter digitizes voltages on at the output node.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

As used in the claims, the word "asserted" means that a signal has the logic level required to turn on the component to which it is passed. For example, an "asserted" signal turns on a transistor, regardless of whether the transistor is n-channel or p-channel; similarly, an "asserted" signal closes a switch.

Figure 1:
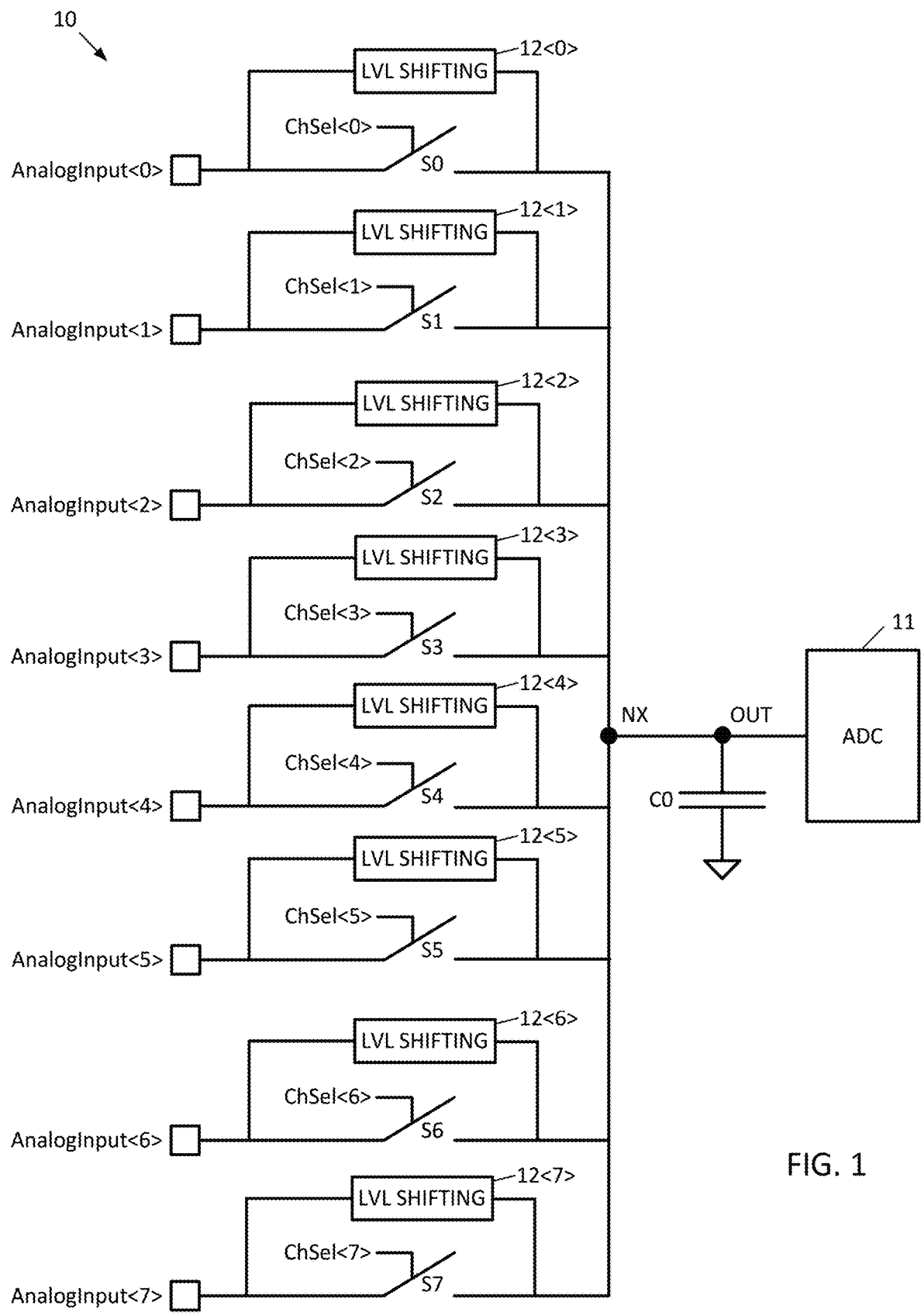
FIG. 1 is a block diagram of a multiplexing input circuit for an analog to digital converter, in accordance with this disclosure.

Shown in FIG. 1 is a circuit diagram for an eight channel multiplexer 10 that receives eight analog inputs at its eight analog input nodes AnalogInput<0>-AnalogInput<7>. Eight channel selection switches S0-S7 are respectively connected between the analog input nodes AnalogInput<0>-AnalogInput<7> and node NX, and are respectively controlled by eight channel selection signals ChSel<0>-ChSel<7>. Under control of the channel selection signals ChSel<0>-ChSel<7>, the channel selection switches S0-S7 selectively connect a selected one of the analog input nodes AnalogInput<0>-AnalogInput<7> at a time to node NX, which in turn is connected to the input of the analog to digital converter (ADC) 11 at node OUT, in accordance with a timing that will be described below, so that the ADC 11 digitizes the signal at the selected analog input node AnalogInput<0>-AnalogInput<7>. Level shifting circuits 12<0>-12<7> are respectively connected in parallel with the channel selection switches S0-S7 between the analog input nodes AnalogInput<0>-AnalogInput<7> and the node NX. The level shifting circuits 12<0>-12<7>, as will be explained below, serve to charge or discharge the sampling capacitor C0 at the input of the ADC 11 at node OUT to slightly below/above the voltage of the analog input node AnalogInput<0>-AnalogInput<7> of the selected channel prior to closing of the channel selection switch S0-S7 of the selected channel, so that the charge taken from the analog input node AnalogInput<0>-AnalogInput<7> of the selected channel to the sampling capacitor C0 when the channel selection switch S0-S7 of the selected channel is closed is low in magnitude.

Figure 2:
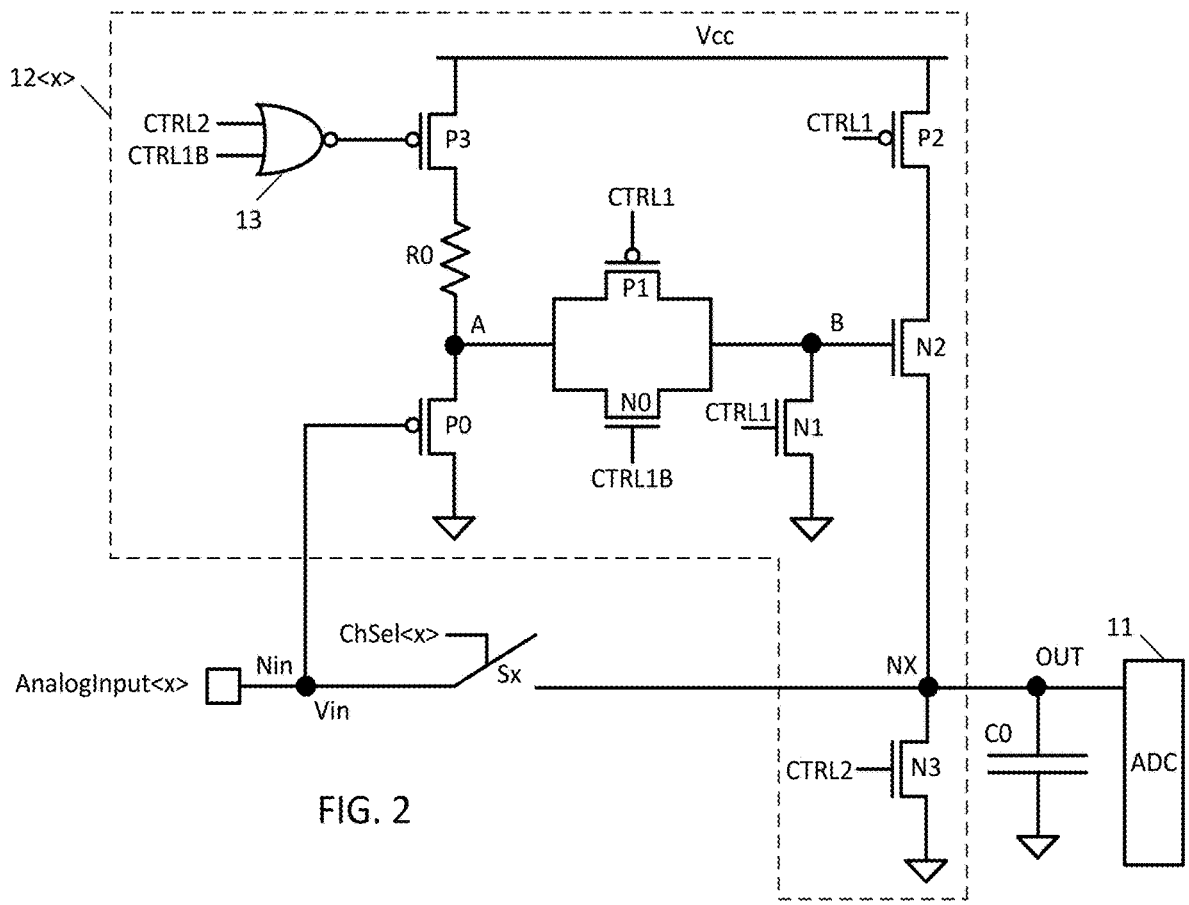
FIG. 2 is a schematic diagram of a sample level shifting circuit such as may be used in the multiplexing input circuit of FIG. 1.

One possible variant of a level shifting circuit 12<x>, such as may be used as the level shifting circuits 12<0>-12<7> in the multiplexer 10 of FIG. 1, is now described with reference to FIG. 2. Here, an input voltage VIN is present at the input node Nin, which is connected to the analog input node AnalogInput<x>. The level shifting circuit 12<x> includes an n-channel transistor N3 having its drain connected to node NX, its source connected to ground, and its gate connected to control signal CTRL2. The sampling capacitor C0 is connected between the output node OUT and ground, and the output node OUT is connected to the node NX. A p-channel transistor P0 has its source connected to node A, its drain connected to ground, and its gate connected to the input node Nin. A p-channel transistor P3 has its source connected to the supply voltage VCC, its drain connected to the source of the p-channel transistor P0 through resistor R0, and its gate connected to the output of NOR gate 13. NOR gate 13 receives as input the control signal CTRL2 and the complement of the control signal CTRL1 (represented as CTRL1B for shorthand), and provides its output to the gate of p-channel transistor P3.

An n-channel transistor N1 has its drain connected to node B, its source connected to ground, and its gate connected to the control signal CTRL1. An n-channel transistor N2 has its drain connected to the drain of p-channel transistor P2, its source connected to node NX, and its gate connected to node B. The p-channel transistor P2 has its source connected to the supply voltage VCC, its drain connected to the drain of the n-channel transistor N2, and its gate connected to the control signal CTRL1.

A transmission gate formed by p-channel transistor P1 and n-channel transistor N0 is connected between nodes A and B. In particular, the p-channel transistor P1 has its source connected to node A, its drain connected to node B, and its gate connected to the control signal CTRL1, while the n-channel transistor N0 has its drain connected to node A, its source connected to node B, and its gate connected to the complement of the first control signal CTRL1B.

Figure 3:
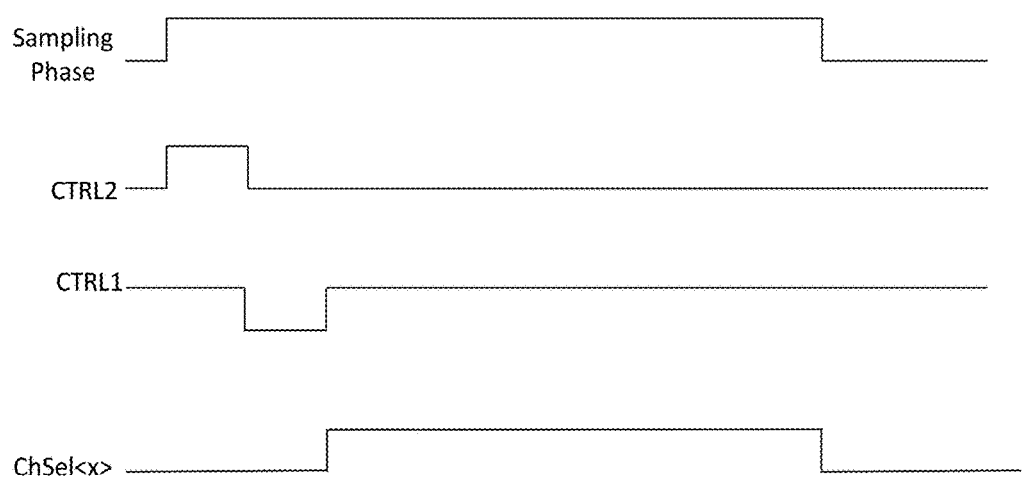
FIG. 3 is a timing diagram of the level shifting circuit of FIG. 2 in operation.

Operation of the level shifting circuit 12<x> is now described with additional reference to FIG. 3. The below description is for the case where the channel associated with the level shifting circuit 12<x> is selected; each other channel is deselected (meaning that the CTRL1 signals of the deselected channels remain high while the CTRL2 signals of the deselected channels remain low). Therefore, for the selected channel to which the level shifting circuit 12<x> is associated, at time T0, in response to the rising edge of the first clock CLK pulse, a sampling phase of the ADC 11 begins with the control signal CTRL2 rising to a logic high, while the control signal CTRL1 remains at a logic high. Note that ChSel<x> remains at a logic low.

As a result of CTRL2 being high, n-channel transistor N3 turns on, discharging the sampling capacitor C0. As a result of CTRL1 being high, the transmission gate formed by p-channel transistor P1 and n-channel transistor N0 is turned off, the p-channel transistor P2 is turned off, and the n-channel transistor N1 turns on to sink current from node B to maintain n-channel transistor N2 in an off state.

As a result of CTRL2 being high and CTRL1B being low (because CTRL1 is high), the output of the NOR gate 13 is a logic low, turning on p-channel transistor P3. Since the p-channel transistor P0 in combination with the resistor R0 forms a source follower amplifier, the voltage at node A will rise to the voltage at AnalogInput<x> plus the magnitude of the threshold voltage Vth of the p-channel transistor P0. The voltage at node A can therefore be mathematically represented as:

$$Va = VIN + |Th_{P0}|$$

At time T1, the control signals CTRL2 and CTRL1 fall low, and again note that ChSel<x> remains low. This turns on p-channel transistor P1 and n-channel transistor N0, and since this also turns off the n-channel transistor N1, this allows the voltage at node B to equal the voltage at node A. The voltage at node B can therefore be mathematically represented as:

$$Vb = Va = VIN + |Th_{P0}|$$

Since CTRL1 being low turns on p-channel transistor P2, and since the n-channel transistor N2 is a source follower, the n-channel transistor N2 sources current to the output node N2 to charge the sampling capacitor C0 until the voltage at the output node OUT becomes equal to the voltage at node B less the threshold voltage of the n-channel transistor N2. Mathematically, the voltage at the output node OUT becomes equal to:

$$VOUT = Vb - Th_{N2} = VIN + |Th_{P0}| - Th_{N2}$$

Due the process variation and the fact that transistors P0 and N2 are not ideal, this means that the threshold voltages of P0 and N2 are not equal. In the case that the threshold voltage of N2 is greater than the magnitude of the threshold voltage of P0, VOUT will be less than VIN. In the opposite case, VOUT can be slightly higher than VIN. The above equations remain accurate unless VIN is one threshold lower than the supply voltage VCC.

At time T2, CTRL2 remains low, while CTR1 rises high. Note that at this point, ChSel<x> rises high closing the switch Sx to select the channel associated with the level shifting circuit 12<x>, while the corresponding ChSel signals of each level shifting circuit 12 of each other channel remains low to keep their respective switches Sx off. Switch Sx closing will cause current to flow from the analog input node AnalogInput<x> to the sampling capacitor C0 to charge the sampling capacitor C0 to VIN. However, since the sampling capacitor C0 will be charged to nearly VIN between times T1 and T2 (VIN less/more the difference between the magnitude of the threshold voltage of P0 and the threshold voltage of N2), the current flowing from the analog input node AnalogInput<x> to the output node OUT will be low, being much lower in magnitude than the current typically flowing from the analog input node to the output node in prior art designs.

The sampling phase ends at time T3.

Figure 4:
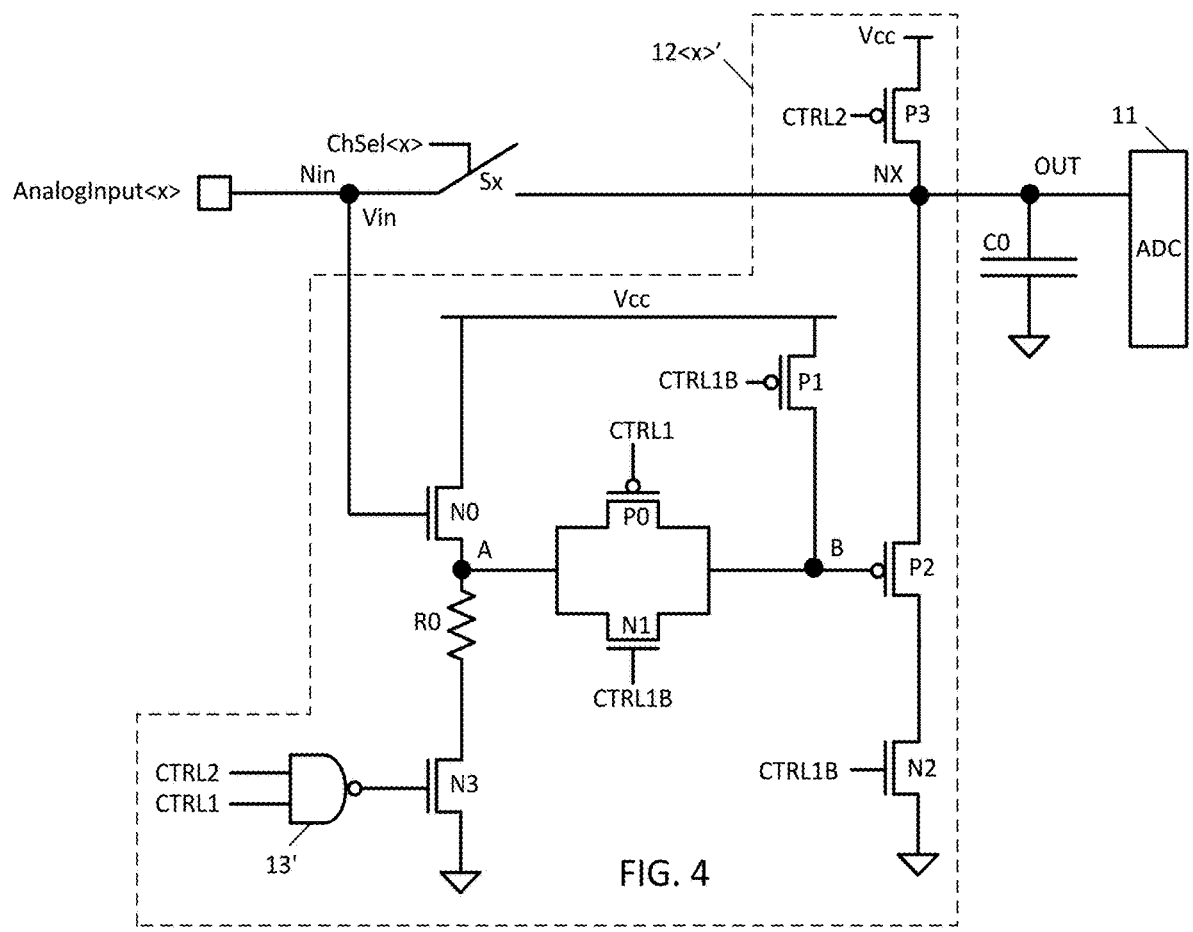
FIG. 4 is a schematic diagram of an alternative sample level shifting circuit such as may be used in the multiplexing input circuit of FIG. 1.

A variant 12<x>' is shown in FIG. 4. The primary difference here is that the sampling capacitor C0 is charged to the supply voltage VCC and then discharged to remain in the proximity of VIN prior to switch Sx closing.

Details are now given. Here, p-channel transistor P3 has its source connected to the supply voltage VCC, its drain connected to the node NX, and its gate connected to the control signal CTRL2. In addition, the sampling capacitor C0 is connected between the output node OUT and ground. The node NX is connected to the output node OUT. The n-channel transistor N0 has its drain connected to VCC, its source connected to node A, and its gate connected to the input node Nin. N-channel transistor N3 has its drain connected to node A through the resistor R0, its source connected to ground, and its gate connected to the output of the NAND gate 13'. The NAND gate 13' receives the control signals CTRL1 and CTRL2 as input and provides its output to the gate of the n-channel transistor N3.

P-channel transistor P1 has its source connected to VCC, its drain connected to node B, and its gate connected to the complement of the first control signal CTRL1B. P-channel transistor P2 has its source connected to the node NX, its drain connected to the drain of n-channel transistor N2, and its gate connected to node B. N-channel transistor N2 has its drain connected to the drain of p-channel transistor P1, its source connected to ground, and its gate connected to the complement of the first control signal CTRL1B.

A transmission gate is formed by p-channel transistor P0 and n-channel transistor N1. In particular, p-channel transistor P0 has its source connected to node B, its drain connected to node A, and its gate connected to the control signal CTRL1, while n-channel transistor N1 has its drain connected to node B, its source connected to node A, and its gate connected to the complement of the first control signal CTRL1B.

Figure 5:
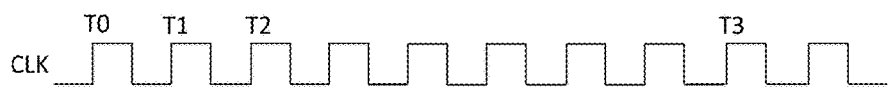
FIG. 5 is a timing diagram of the level shifting circuit of FIG. 4 in operation.
Figure 5:
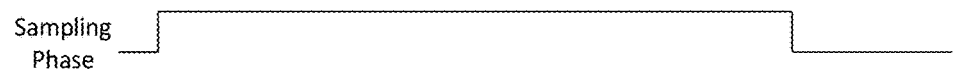
Figure 5:
Figure 5:
Figure 5:

Operation of the level shifting circuit 12<x>' is now described with additional reference to FIG. 5. The below description is for the case where the channel associated with the level shifting circuit 12<x>' is selected; each other channel is deselected (meaning that the CTRL1 signals of the deselected channels remain high while the CTRL2 signals of the deselected channels remain low). Therefore, for the selected channel to which the level shifting circuit 12<x>' is associated. At time T0, in response to the rising edge of the first clock CLK pulse, a sampling phase of the ADC 11 begins with the control signal CTRL2 falling to a logic low, while the control signal CTRL1 remains at a logic high. Note that ChSel<x> remains at a logic low.

As a result of CTRL2 being low, p-channel transistor P3 turns on, charging the sampling capacitor C0 to the supply voltage VCC. As a result of CTRL1 being high, the transmission gate formed by p-channel transistor P0 and n-channel transistor N1 is turned off, the n-channel transistor N2 is turned off, and the p-channel transistor P1 turns on to source current to node B to maintain p-channel transistor P2 in an off state.

As a result of CTRL2 being low and CTRL1 being high, the output of the NAND gate 13' is a logic high, turning on n-channel transistor N3. Since the n-channel transistor N0 in combination with the resistor R0 forms a source follower amplifier, the voltage at node A will rise to the voltage at AnalogInput<x> less the magnitude of the threshold voltage Vth of the n-channel transistor N0. The voltage at node A can therefore be mathematically represented as:

$$Va = VIN - Th_{N0}$$

At time T1, the control signal CTRL1 falls low while the control signal CTRL2 rises high, and again note that ChSel<x> remains low. This turns on p-channel transistor P0 and n-channel transistor N1, and since this also turns off the p-channel transistor P1, this allows the voltage at node B to become equal the voltage at node A. The voltage at node B can therefore be mathematically represented as:

$$Vb = Va = VIN - Th_{N_0}$$

Since CTRL1 being low turns on n-channel transistor N2, and since the p-channel transistor P2 is a source follower, the p-channel transistor P2 sinks current from the node NX to discharge the sampling capacitor C0 until the voltage at the output node OUT becomes equal to the voltage at node B plus the magnitude of the threshold voltage of the p-channel transistor P2. Mathematically therefore, the voltage at the output node OUT becomes equal to:

$$VOUT = Vb + ThP_2 = VIN + |Th_{P2}| - Th_{N0}$$

Due the process variation and the fact that transistors P2 and N0 are not ideal, this means that the threshold voltages of P2 and N0 are not equal. In the case that the threshold voltage of N0 is greater than the magnitude of the threshold voltage of P2, VOUT will be less than VIN. In the opposite case, VOUT can be slightly higher than VIN.

At time T2, CTRL2 remains high, while CTR1 rises high. Note that at this point, ChSel<x> rises high closing the switch Sx to select the channel associated with the level shifting circuit 12<x>', while the corresponding ChSel signals of each other channel of each other channel remains low to keep their respective switches Sx off. Switch Sx closing will cause current to flow from the analog input node AnalogInput<x> to the sampling capacitor C0 to charge the sampling capacitor C0 to VIN. However, since the sampling capacitor C0 will be charged to nearly VIN between times T1 and T2, the current flowing from the analog input node AnalogInput<x> to the output node OUT will be low, being much lower in magnitude than the current typically flowing from the analog input node to the output node in prior art designs.

The sampling phase ends at time T3. In both above embodiments, process trimming option can be used to remove the mismatch between PMOS and NMOS threshold voltages to keep the charge from the analog input nodes to the minimum. As an example, the trimming of resistor R0 can achieve this.

Figure 6:
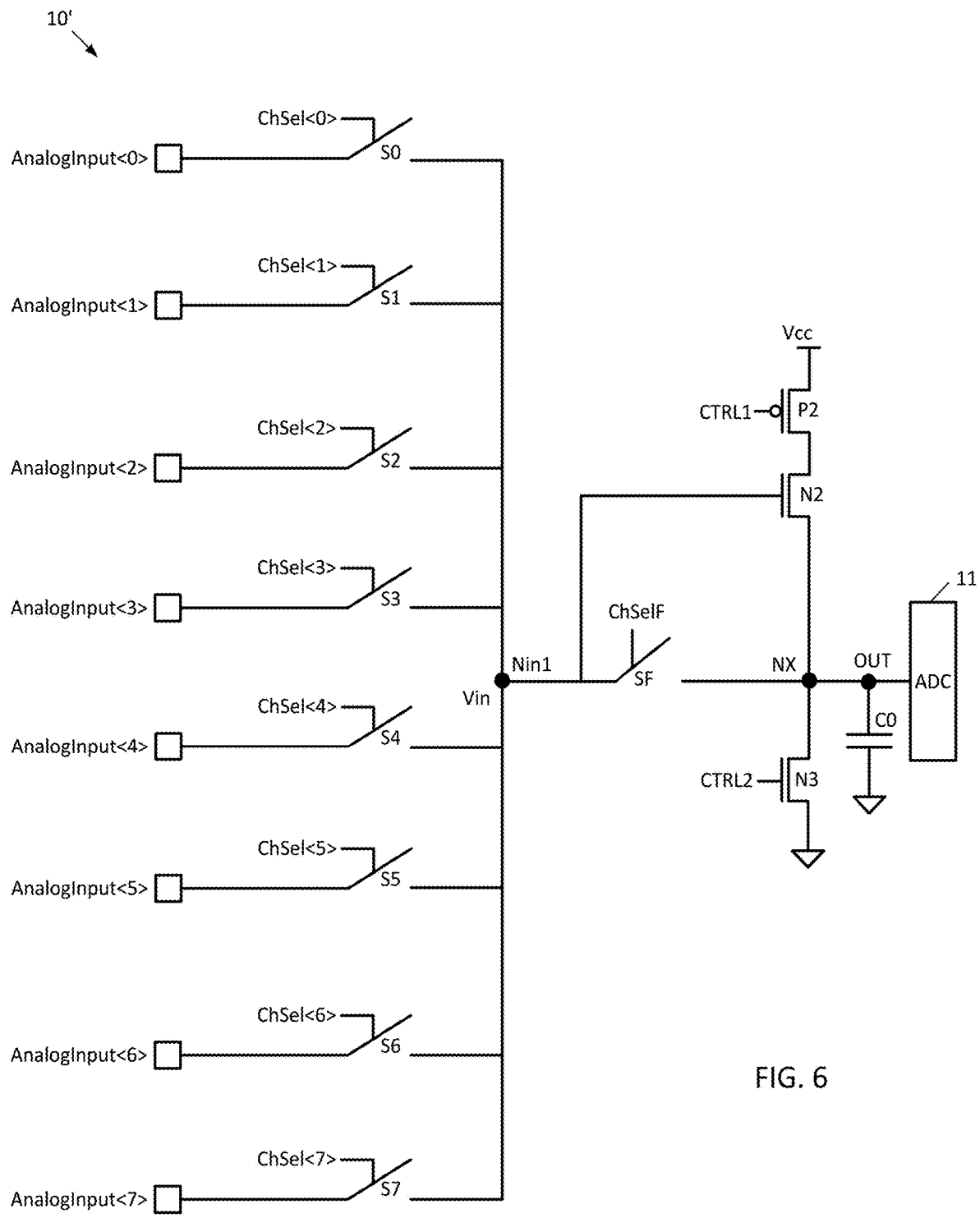
FIG. 6 is a schematic diagram of another multiplexing input circuit for an analog to digital converter, in accordance with this disclosure.

Another design for a multiplexer 10' that results in less current sourced to the sampling capacitor C0 than prior art designs is shown in FIG. 6. Here, the multiplexer 10' is an eight channel multiplexer 10' that receives eight analog inputs at its eight analog input nodes AnalogInput<0>-AnalogInput<7>. Eight channel selection switches S0-S7 are respectively connected between the analog input nodes AnalogInput<0>-AnalogInput<7> and node Nin1, and are respectively controlled by eight channel selection signals ChSel<0>-ChSel<7>. Under control of the channel selection signals ChSel<0>-ChSel<7>, the channel selection switches S0-S7 selectively connect a selected one of the analog input nodes AnalogInput<0>-AnalogInput<7> at a time to the node Nin1, in accordance with a timing as will be described below.

Here, a final selection switch SF is connected between node Nin1 and node NX (node NX in turn being connected to the output node OUT), and operates under control of the final channel selection signal ChSelF. An n-channel transistor N3 has its drain connected to the node NX, its source connected to ground, and its gate connected to the control signal CTRL2. A p-channel transistor P2 has its source connected to the supply voltage VCC, its drain connected to the drain of n-channel transistor N2, and its gate connected to the control signal CTRL1. The n-channel transistor N2 has its drain connected to the drain of the p-channel transistor P2, its source connected to the node NX, and its gate connected to the node Nin1.

Figure 7:
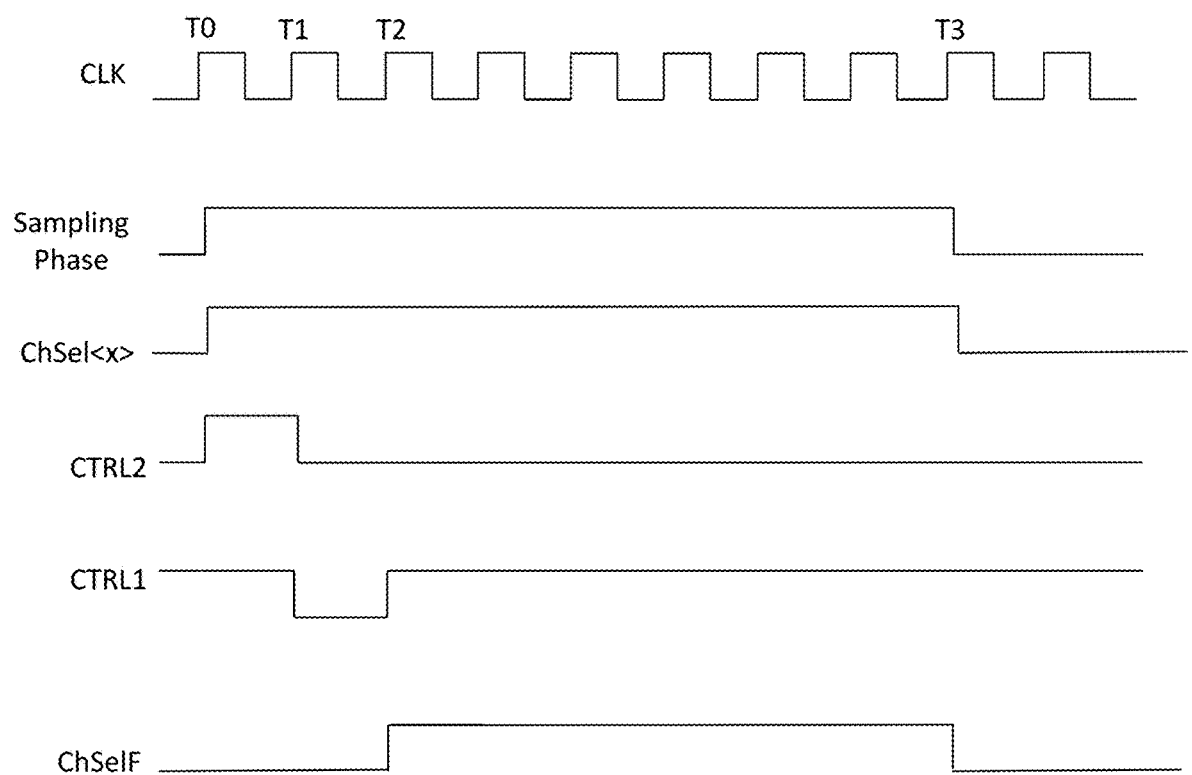
FIG. 7 is a timing diagram of the multiplexing input circuit of FIG. 6 in operation.

Operation of the multiplexer 10' is now described with additional reference to FIG. 7. At time T0, in response to the rising edge of the first clock CLK pulse, a sampling phase of the ADC 11 begins with the control signal CTRL2 rising to a logic high, while the control signal CTRL1 remains at a logic high. Note that ChSel<x> (with x corresponding to ChSel of the selected channel) rises to a logic high while ChSelF remains at a logic low. ChSel for every non-selected channel remains low.

In response to ChSel<x> rising to a logic high, the corresponding switch S closes, charging node Nin1 to Vin. Since the control signal CTRL1 remains at a logic high, the p-channel transistor P2 remains off, permitting the discharge of the sampling capacitor C0. Since the control signal CTRL2 is at a logic high, the n-channel transistor N3 will turn on, discharging the sampling capacitor C0 between time periods T0 and T1.

At time T1, in response to the rising of the second clock CLK pulse, the control signals CTRL1 and CTRL2 both fall to a logic low. Note that ChSel<x> remains at a logic high while ChSelF remains at a logic low. Since CTRL2 is a logic low, n-channel transistor N3 turns off, and since CTRL1 is low, p-channel transistor P2 turns on. The result of this is that the n-channel transistor N2 sources sufficient current to the sampling capacitor C0 between times T1 and T2 to charge the sampling capacitor C0 nearly to VIN (VIN less the threshold voltage of the n-channel transistor N2). Mathematically, this can be represented as:

$$VOUT=VIN-Th_{N2}$$

At time T2, in response to the rising of the third clock CLK pulse, the control signal CTRL1 rises to a logic high while the control signal CTRL2 remains at a logic low. Note that ChSelF here rises to a logic high while ChSel<x> remains at a logic high. Since the switch SF is closed in response to ChSelF going high, the selected analog input AnalogInput will source sufficient current to the output node OUT to charge VOUT to be equal to VIN. The current flowing from the analog input AnalogInput to the output node OUT will be low, being much lower in magnitude than the current typically flowing from the analog input node to the output node in prior art designs.

At time T3, the sampling phase of the ADC 11 ends. This is an area efficient logic as only this small logic will be needed for the complete multiplexer 10', with the addition of switch SF. Here the analog input AnalogInput always provides a charge corresponding to the threshold voltage of N2.

Figure 8:
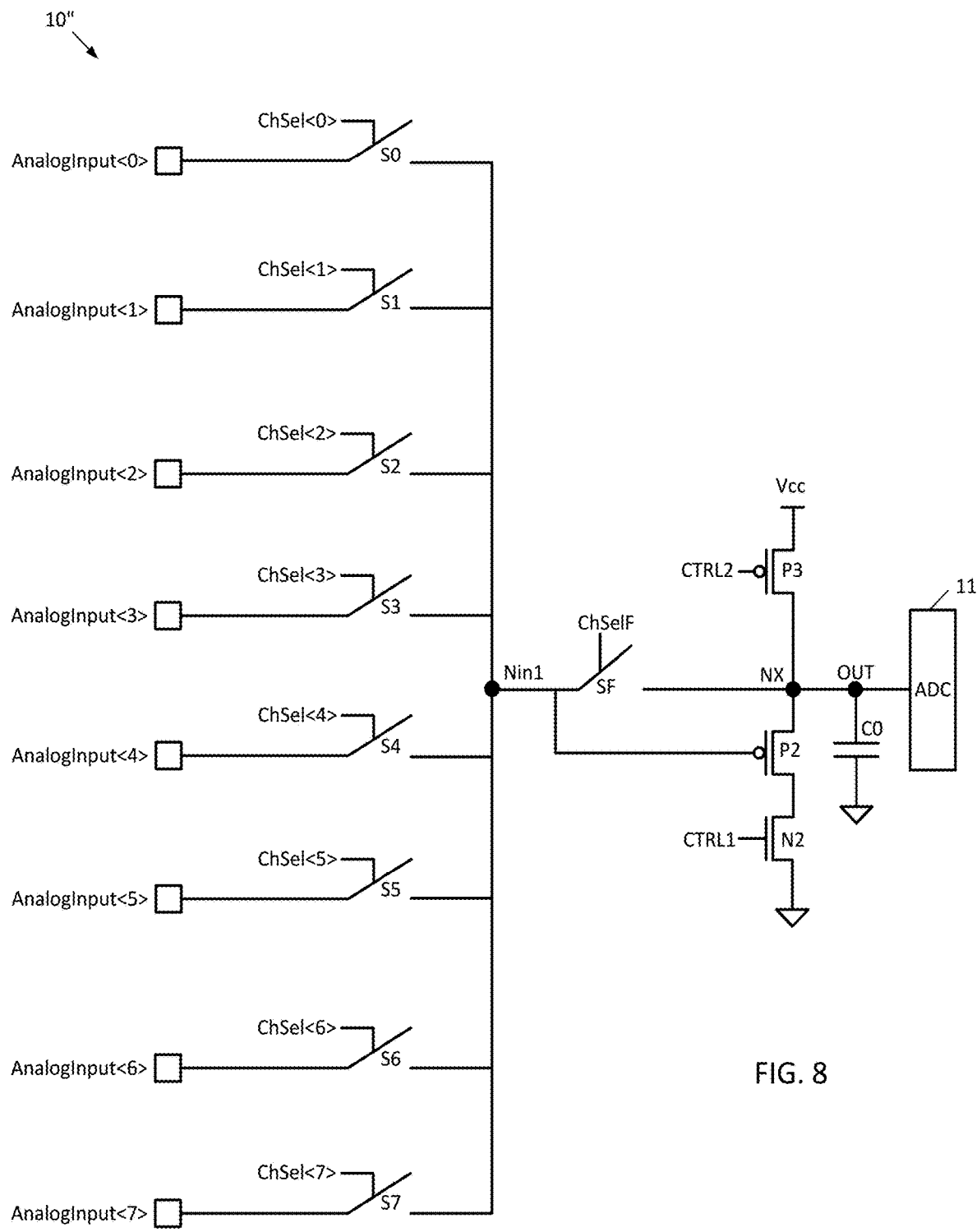
FIG. 8 is a schematic diagram of yet another multiplexing input circuit for an analog to digital converter, in accordance with this disclosure.

A variant of the multiplexer 10" is now described with reference to FIG. 8. The multiplexer 10" is an eight channel multiplexer 10 that receives eight analog inputs at its eight analog input nodes AnalogInput<0>-AnalogInput<7>. Eight channel selection switches S0-S7 are respectively connected between the analog input nodes AnalogInput<0>-AnalogInput<7> and node Nin1, and are respectively controlled by eight channel selection signals ChSel<0>-ChSel<7>. Under control of the channel selection signals ChSel<0>-ChSel<7>, the channel selection switches S0-S7 selectively connect a selected one of the analog input nodes AnalogInput<0>-AnalogInput<7> at a time to the node Nin1, in accordance with a timing as will be described below.

Here, a final selection switch SF is connected between node Nin1 and node NX (which in turn is connected to the output node OUT), and operates under control of the final channel selection signal ChSelF. A p-channel transistor P3 has its drain connected to the nodeNX, its source connected to the supply voltage VCC, and its gate connected to the control signal CTRL2. A p-channel transistor P2 has its source connected to the node NX, its drain connected to the drain of n-channel transistor N2, and its gate connected to node Nin1. The n-channel transistor N2 has its drain connected to the drain of the p-channel transistor P2, its source connected to ground, and its gate connected to the control signal CTRL1.

Figure 9:
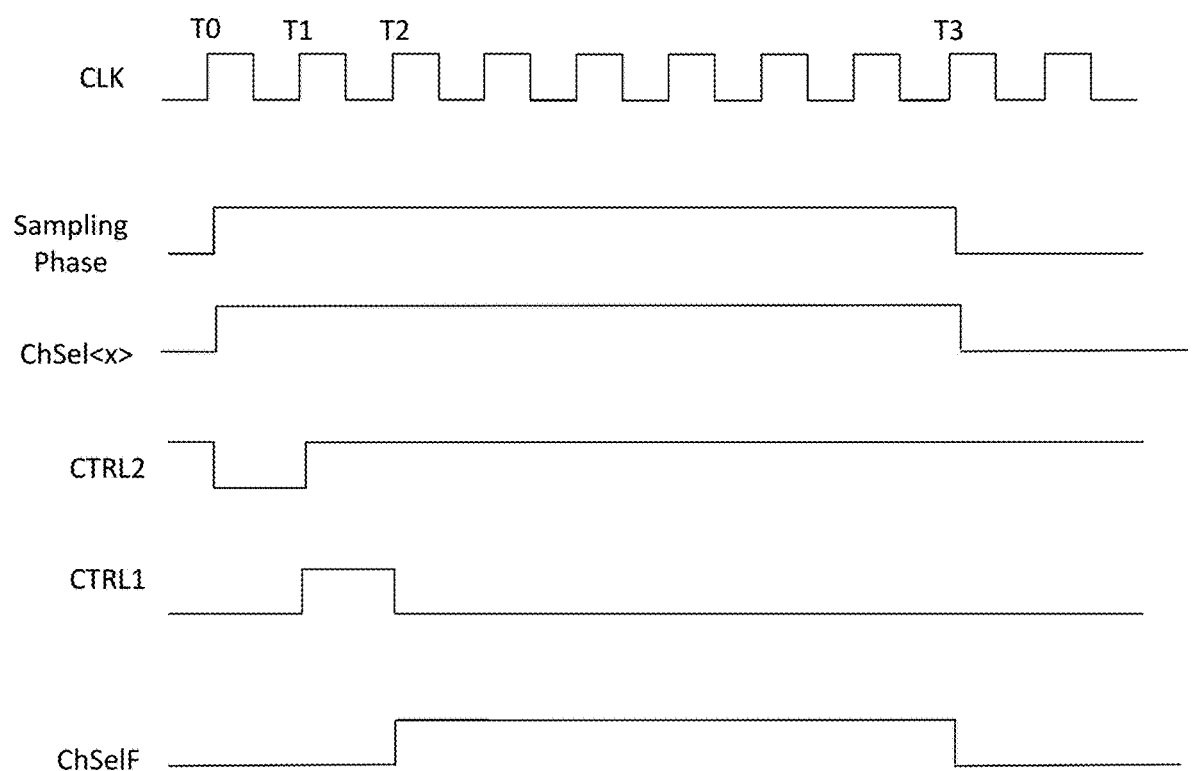
FIG. 9 is a timing diagram of the multiplexing input circuit of FIG. 8 in operation.

With additional reference to FIG. 9, operation of the multiplexer 10" is now described. At time T0, in response to the rising of the first clock CLK pulse, a sampling phase of the ADC 11 begins with the control signal CTRL2 falling to a logic low, while the control signal CTRL1 remains at a logic low. Note that ChSel<x> rises to a logic high while ChSelF remains at a logic low.

In response to ChSel<x> (which corresponds to ChSel of one of the channels of the multiplexer 10") rising to a logic high, the corresponding switch Sx closes, charging node Nin1 to VIN. Since the control signal CTRL1 remains at a logic low, the n-channel transistor N2 remains off, permitting the charging of the sampling capacitor C0. Since the control signal CTRL2 is at a logic low, the p-channel transistor P3 will turn on, charging the sampling capacitor C0 to VCC between time periods T0 and T1.

At time T1, in response to the rising of the second clock CLK pulse, the control signals CTRL1 and CTRL2 rise to a logic high. Note that ChSel<x> remains at a logic high while ChSelF remains at a logic low. Since CTRL2 is a logic high, p-channel transistor P3 turns off, and since CTRL1 is also at a logic high, n-channel transistor N2 turns on. The result of this is that the p-channel transistor P2 sinks sufficient current from the sampling capacitor C0 between times T1 and T2 to discharge the sampling capacitor nearly to VIN (VIN plus the magnitude of the threshold voltage of the p-channel transistor P2). Mathematically, this can be represented as:

$$VOUT=VIN+|Th_{P2}|$$

At time T2, in response to the rising of the third clock CLK pulse, the control signal CTRL1 falls to a logic low while the control signal CTRL2 remains at a logic high. Note that ChSelF here rises to a logic high while ChSel<x> remains at a logic high. Since the switch SF is closed in response to ChSelF going high, the selected analog input AnalogInput will sink sufficient current from the output node OUT to discharge VOUT to be equal to VIN. The current flowing to the analog input AnalogInput from the output node OUT will be low, being much lower in magnitude than the current typically flowing from the output node to the analog input node in prior art designs.

At time T3, the sampling phase of the ADC 11 ends. This is a very area efficient logic as only this small logic will be needed for the complete multiplexer 10'", with the addition of switch SF. Here the analog input node AnalogInput sinks a charge corresponding to the threshold voltage of P2.

Figure 10:
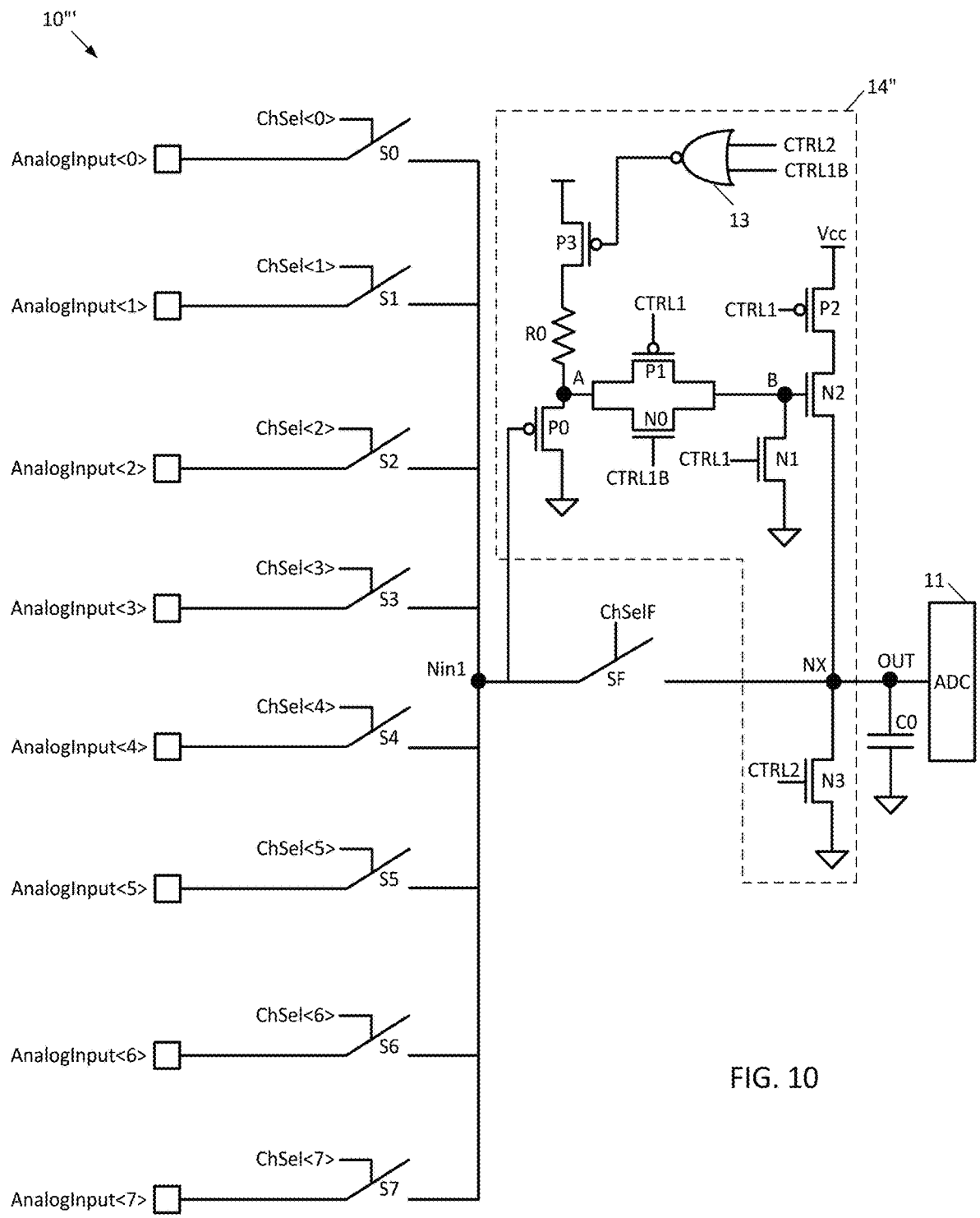
FIG. 10 is a schematic diagram of a further multiplexing input circuit for an analog to digital converter, in accordance with this disclosure.

Another variant of multiplexer 10'" is shown in FIG. 10. The multiplexer 10'" is an eight channel multiplexer 10 that receives eight analog inputs at its eight analog input nodes AnalogInput<0>-AnalogInput<7>. Eight channel selection switches S0-S7 are respectively connected between the analog input nodes AnalogInput<0>-AnalogInput<7> and node Nin1, and are respectively controlled by eight channel selection signals ChSel<0>-ChSel<7>. Under control of the channel selection signals ChSel<0>-ChSel<7>, the channel selection switches S0-S7 selectively connect a selected one of the analog input nodes AnalogInput<0>-AnalogInput<7> at a time to the node Nin1, in accordance with a timing as will be described below.

Here, a final selection switch SF is connected between node Nin1 and node NX (which in turn is connected to the output node OUT), and operates under control of the final channel selection signal ChSelF.

The multiplexer 10'" includes an n-channel transistor N3 having its drain connected to the node NX, its source connected to ground, and its gate connected to control signal CTRL2. A p-channel transistor P0 has its source connected to node A, its drain connected to ground, and its gate connected to node Nin1. A p-channel transistor P3 has its source connected to the supply voltage VCC, its drain connected to the source of the p-channel transistor P0 through resistor R0, and its gate connected to the output of NOR gate 13. NOR gate 13 receives as input the control signal CTRL2 and the complement of the control signal CTRL1 (represented as CTRL1B for shorthand), and provides its output to the gate of p-channel transistor P3.

An n-channel transistor N1 has its drain connected to node B, its source connected to ground, and its gate connected to the control signal CTRL1. An n-channel transistor N2 has its drain connected to the drain of p-channel transistor P2, its source connected to the node NX, and its gate connected to node B. The p-channel transistor P2 has its source connected to the supply voltage VCC, its drain connected to the drain of the n-channel transistor N2, and its gate connected to the control signal CTRL1.

A transmission gate formed by p-channel transistor P1 and n-channel transistor N0 is connected between nodes A and B. In particular, the p-channel transistor P1 has its source connected to node A, its drain connected to node B, and its gate connected to the control signal CTRL1, while the n-channel transistor N0 has its drain connected to node A, its source connected to node B, and its gate connected to the complement of the first control signal CTRL1B.

Figure 11:
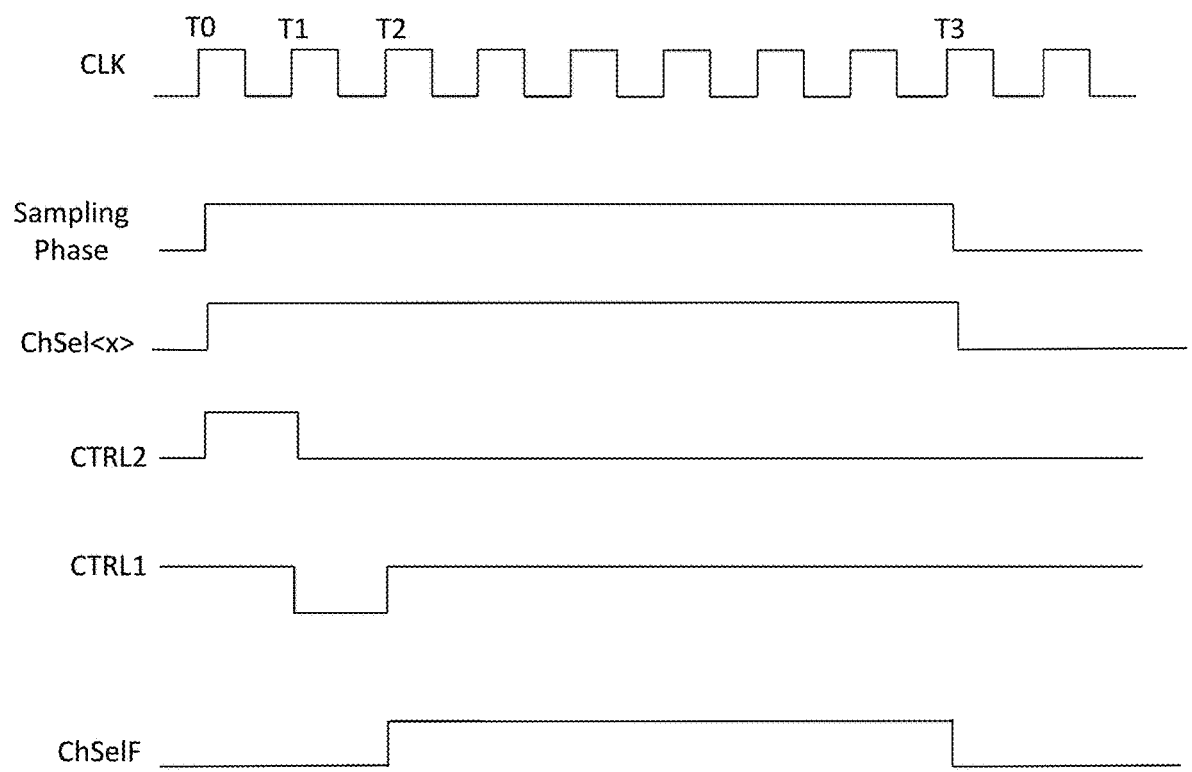
FIG. 11 is a timing diagram of the multiplexing input circuit of FIG. 10 in operation.

Operation of the multiplexer 10''' is now described with additional reference to FIG. 11. At time T0, in response to the rising of the first clock CLK pulse, a sampling phase of the ADC 11 begins with the control signal CTRL2 rising to a logic high, while the control signal CTRL1 remains at a logic high. Note that ChSel<x> rises to a logic high while ChSelF remains at a logic low As a result of CTRL2 being high, n-channel transistor N3 turns on, discharging the sampling capacitor C0. As a result of CTRL1 being high, the transmission gate formed by p-channel transistor P1 and n-channel transistor N0 is turned off, the p-channel transistor P2 is turned off, and the n-channel transistor N1 turns on to sink current from node B to maintain n-channel transistor N2 in an off state.

As a result of CTRL2 being high and CTRL1B being low (because CTRL1 is high), the output of the NOR gate 13 is a logic low, turning on p-channel transistor P3. Since the p-channel transistor P0 in combination with the resistor RO forms a source follower amplifier, the voltage at node A will rise to VIN plus the magnitude of the threshold voltage Vth of the p-channel transistor P0. The voltage at node A can therefore be mathematically represented as:

$$Va = VIN + |Th_{P0}|$$

At time T1, the control signals CTRL2 and CTRL1 fall low, and again note that ChSel<x> remains high. This turns on p-channel transistor P1 and n-channel transistor N0, and since this also turns off the n-channel transistor N1, this allows the voltage at node B to equal the voltage at node A. The voltage at node B can therefore be mathematically represented as:

$$Vb = Va = VIN + |Th_{P0}|$$

Since CTRL1 being low turns on p-channel transistor P2, and since the n-channel transistor N2 is a source follower, the n-channel transistor N2 sources current to the output node N2 to charge the sampling capacitor C0 until the voltage at the output node OUT becomes equal to the voltage at node B less the threshold voltage of the n-channel transistor N2. Mathematically therefore, the voltage at the output node OUT becomes equal to:

$$VOUT = Vb - Th_{N2} = VIN + |Th_{P0}| - Th_{N2}$$

Due the process variation and the fact that transistors P0 and N2 are not ideal, this means that the threshold voltages of P0 and N2 are not equal. In the case that the threshold voltage of N2 is greater than the magnitude of the threshold voltage of P0, VOUT will be less than VIN. In the opposite case, VOUT can be slightly higher than VIN.

At time T2, CTRL2 remains low, while CTRL1 rises high. Note that at this point, ChSelF rises high, closing the switch SF. Switch SF closing will cause current to flow from the node Nin1 to the sampling capacitor C0 to charge the sampling capacitor C0 to VIN.

However, since the sampling capacitor C0 will be charged to nearly VIN between times T1 and T2 (VIN less the difference between the magnitude of the threshold voltage of P0 and the threshold voltage of N2), the current flowing from the node Nin1 to the output node OUT will be low, being much lower in magnitude than the current typically flowing to the output node in prior art designs.

The sampling phase ends at time T3. This is an improvement over the embodiment of FIG. 6 as this removes the requirement of an input charge from the analog input node corresponding to threshold voltage of N2. In additional, only this single circuit will be needed for complete multiplexer, so this is a very area efficient design.

Figure 12:
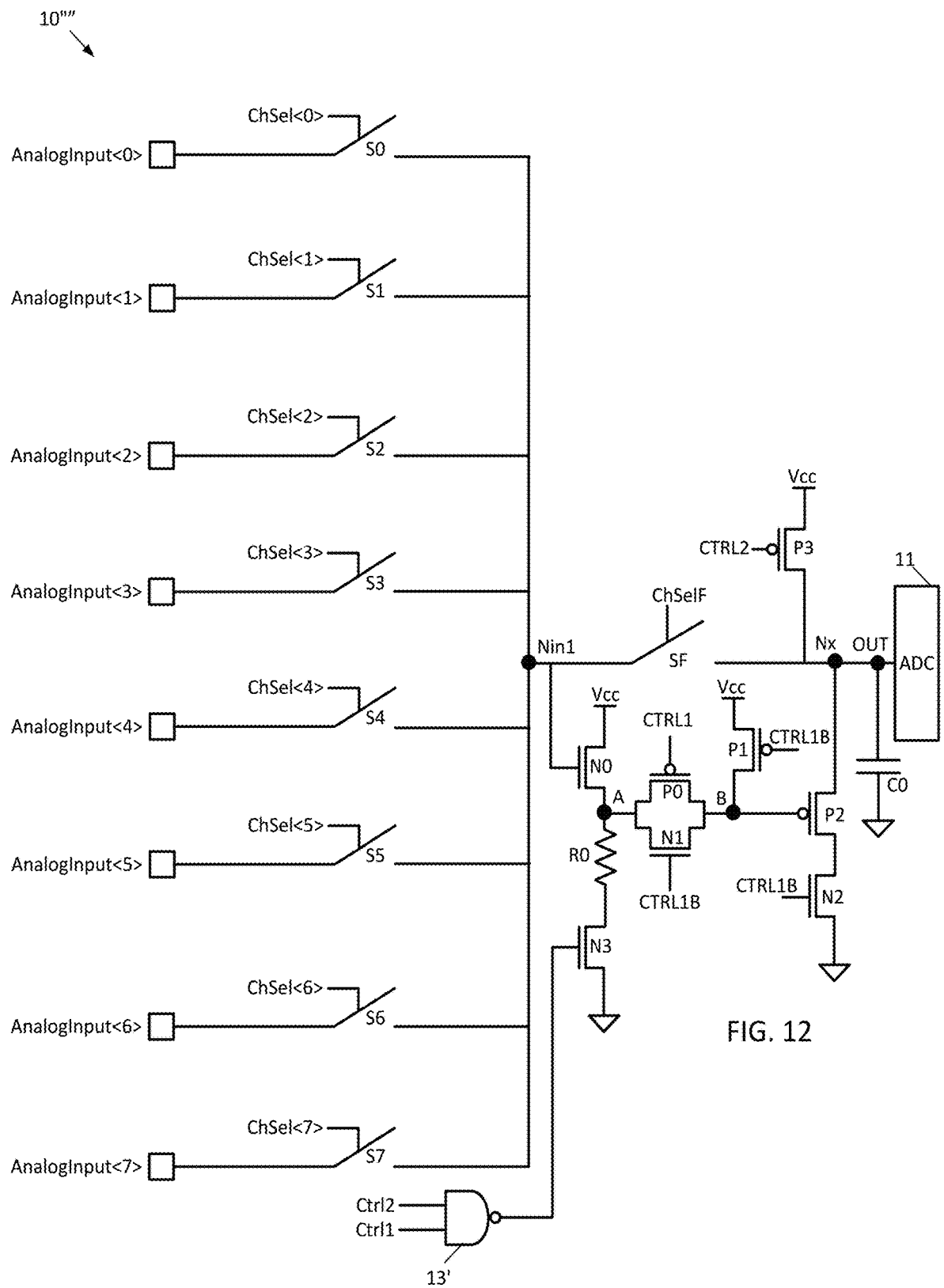
FIG. 12 is a schematic diagram of an additional multiplexing input circuit for an analog to digital converter, in accordance with this disclosure.

A variant of the multiplexer 10'''' is shown in FIG. 12. Here, p-channel transistor P3 has its source connected to the supply voltage VCC, its drain connected to the nodeNX (which in turn is connected to the output node OUT), and its gate connected to the control signal CTRL2. In addition, n-channel transistor N0 has its drain connected to VCC, its source connected to node A, and its gate connected to node Nin1. N-channel transistor N3 has its drain connected to node A through the resistor RO, its source connected to ground, and its gate connected to the output of the NAND gate 13'. The NAND gate 13' receives the control signals CTRL1 and CTRL2 as input and provides its output to the gate of the n-channel transistor N3.

P-channel transistor P1 has its source connected to VCC, its drain connected to node B, and its gate connected to the complement of the first control signal CTRL1B. P-channel transistor P2 has its source connected to the node NX, its drain connected to the drain of n-channel transistor N2, and its gate connected to node B. N-channel transistor N2 has its drain connected to the drain of p-channel transistor P1, its source connected to ground, and its gate connected to the complement of the first control signal CTRL1B.

A transmission gate is formed by p-channel transistor P0 and n-channel transistor N1. In particular, p-channel transistor P0 has its source connected to node B, its drain connected to node A, and its gate connected to the control signal CTRL1, while n-channel transistor N1 has its drain connected to node B, its source connected to node A, and its gate connected to the complement of the first control signal CTRL1B.

Figure 13:
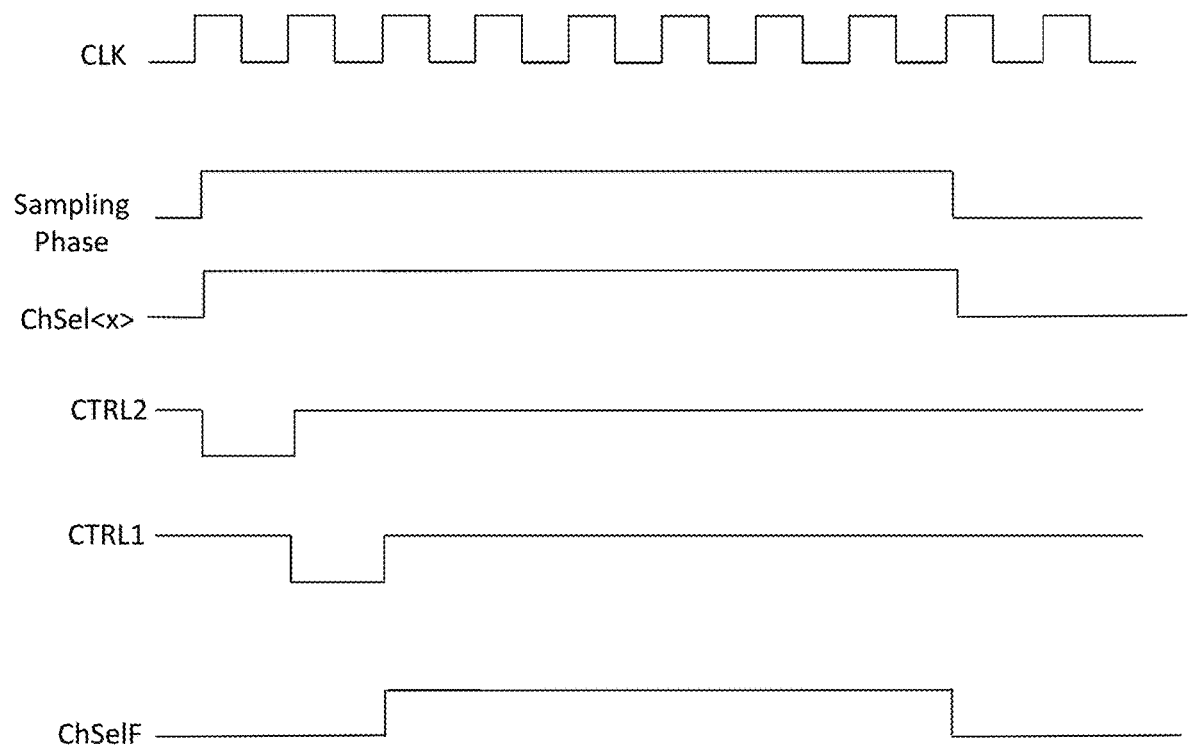
FIG. 13 is a timing diagram of the multiplexing input circuit of FIG. 12 in operation.

Operation of the multiplexer 10'''' is now described with additional reference to FIG. 13. At time T0, in response to the rising of the first clock CLK pulse, a sampling phase of the ADC 11 begins with the control signal CTRL2 falling to a logic low, while the control signal CTRL1 remains at a logic high. Note that ChSel<x> rises to a logic high while ChSelF remains at a logic low.

As a result of CTRL2 being low, p-channel transistor P3 turns on, charging the sampling capacitor C0 to the supply voltage VCC. As a result of CTRL1 being high, the transmission gate formed by p-channel transistor P0 and n-channel transistor N1 is turned off, the n-channel transistor N2 is turned off, and the p-channel transistor P1 turns on to source current to node B to maintain p-channel transistor P2 in an off state.

As a result of CTRL2 being low and CTRL1 being high, the output of the NAND gate 13' is a logic high, turning on n-channel transistor N3. Since the n-channel transistor N0 in combination with the resistor RO forms a source follower, the voltage at node A will rise to the voltage at AnalogInput<x> less the magnitude of the threshold voltage Vth of the n-channel transistor N0. The voltage at node A can therefore be mathematically represented as:

$$Va = VIN - Th_{N0}$$

At time T1, the control signal CTRL1 falls low while the control signal CTRL2 rises high, and again note that ChSel<x> remains high while ChSelF remains low. This turns on p-channel transistor P0 and n-channel transistor N1, and since this also turns off the p-channel transistor P1, this allows the voltage at node B to equal the voltage at node A. The voltage at node B can therefore be mathematically represented as:

$$Vb=Va=VIN-ThN_0$$

Since CTRL1 being low turns on n-channel transistor N2, and since the p-channel transistor P2 is a source follower, the p-channel transistor P2 sinks current from the output node OUT to discharge the sampling capacitor C0 until the voltage at the output node OUT becomes equal to the voltage at node B plus the magnitude of the threshold voltage of the p-channel transistor P2. Mathematically therefore, the voltage at the output node OUT becomes equal to:

$$VOUT=Vb+ThP_2=VIN+|Th_{P2}|-Th_{N0}$$

Due the process variation and the fact that transistors P2 and N0 are not ideal, this means that the threshold voltages of P2 and N0 are not equal. In the case that the threshold voltage of N0 is greater than the magnitude of the threshold voltage of P2, VOUT will be less than VIN. In the opposite case, VOUT can be slightly higher than VIN.

At time T2, CTRL2 remains high, while CTR1 rises high. Note that at this point, ChSel<x> remains high and ChSelF rises high, closing the switch Sx. Switch Sx closing will cause current to flow from node Nin1 to the sampling capacitor C0 to charge the sampling capacitor C0 to VIN. However, since the sampling capacitor C0 will be charged to nearly VIN between times T1 and T2, the current flowing from the node NX to the output node OUT will be low, being much lower in magnitude than the current typically flowing to the output node in prior art designs.

The sampling phase ends at time T3.

Figure 14:
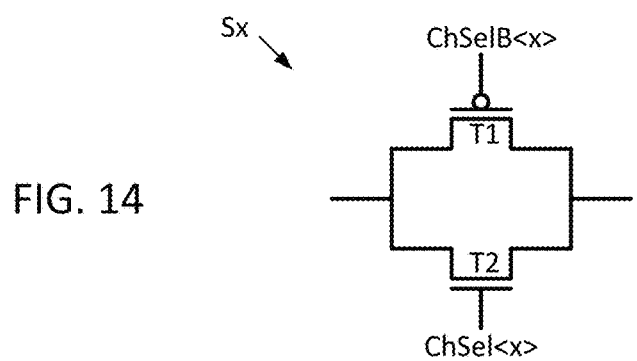
FIG. 14 is a schematic diagram of input switches, such as may be used with the multiplexing input circuits of FIGS. 2, 4, 6, 8, 10, and 12.

As shown in FIG. 14, the switches S0-S7 of any discussed embodiment may be implemented as a transmission gate comprised of p-channel transistor T1 and n-channel transistor T2.

Figure 15:
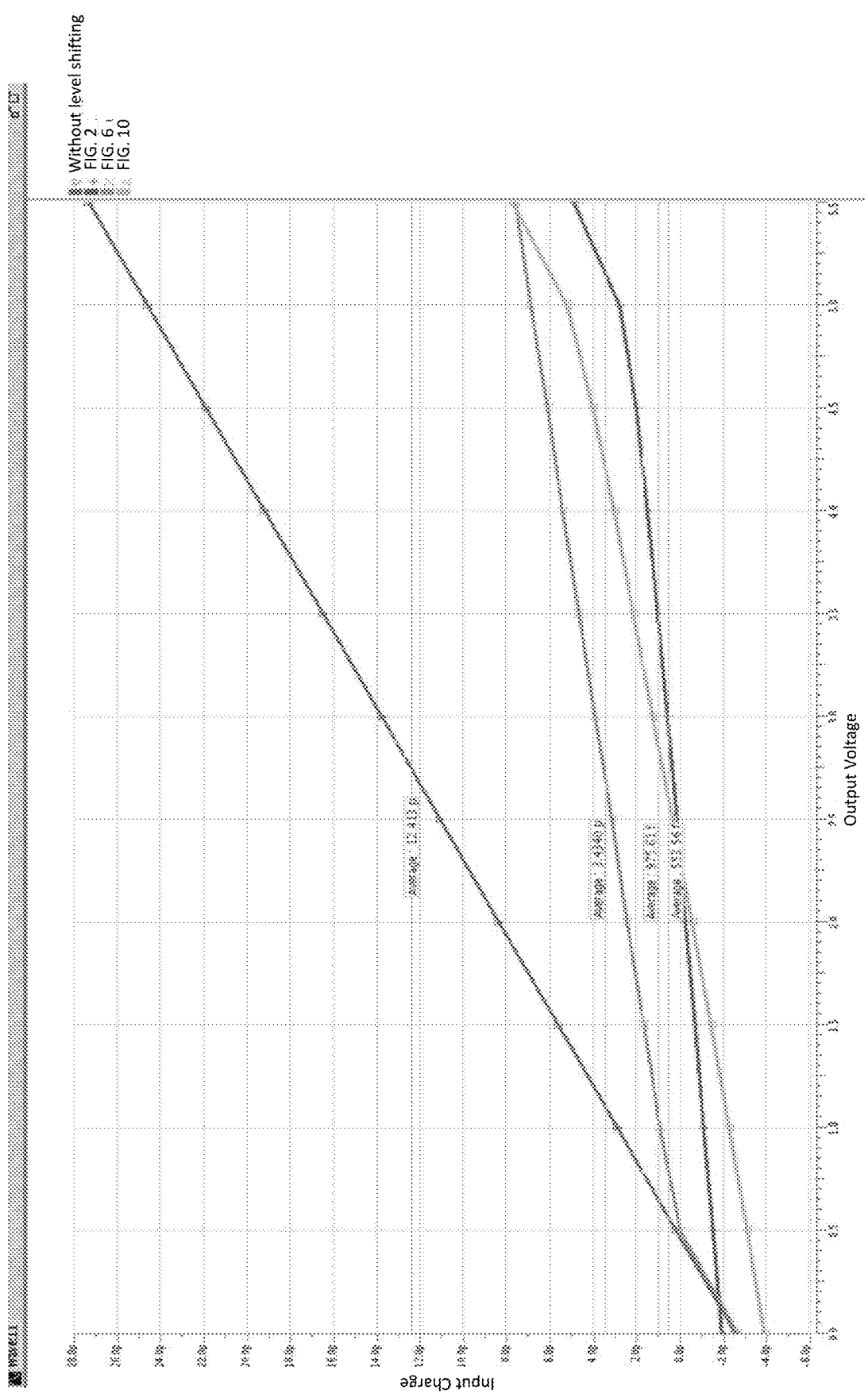
FIG. 15 is first a graph showing input charge across different input voltages, in accordance with the designs of this disclosure.
Figure 16:
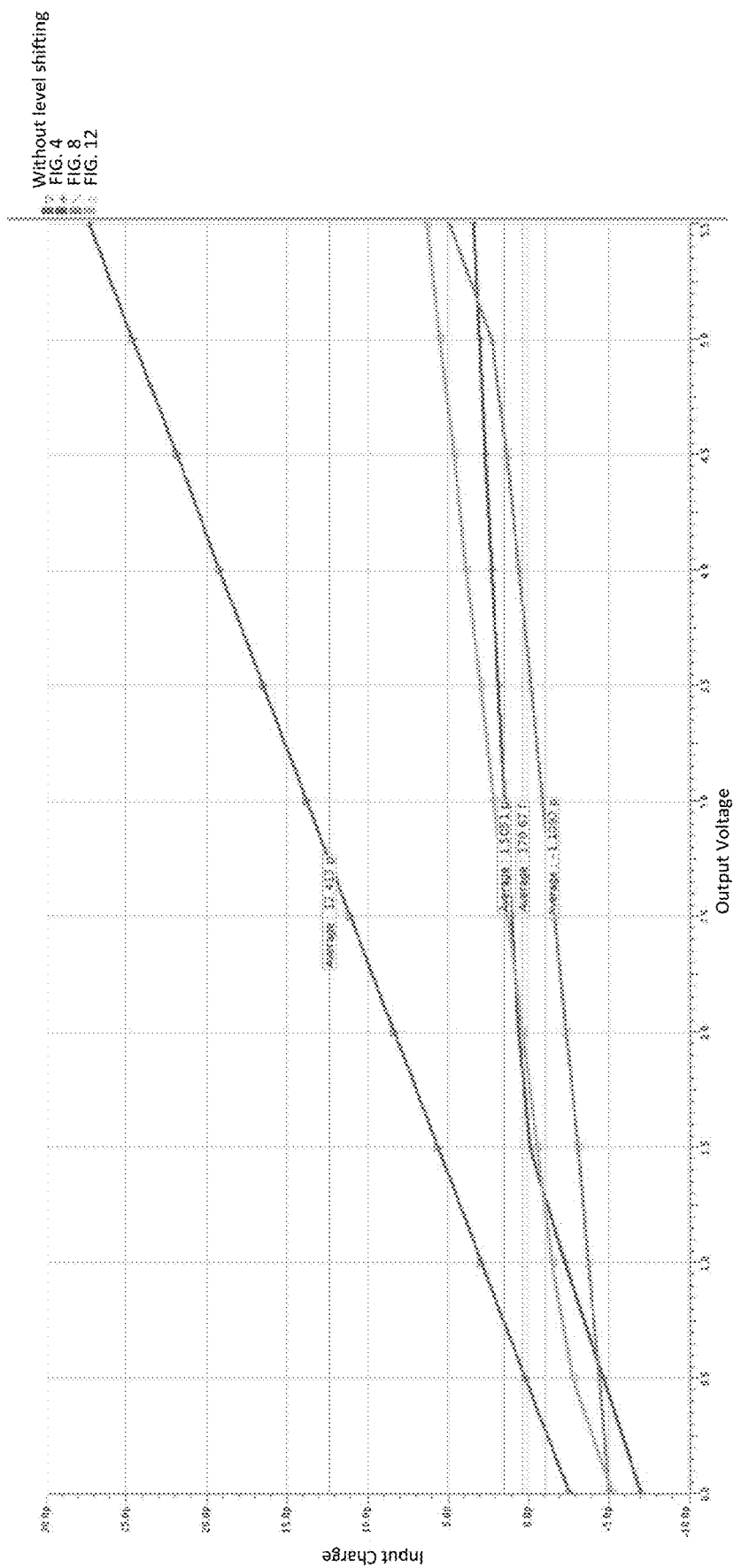
FIG. 16 is a second graph showing input charge across different input voltages, in accordance with the designs of this disclosure.

The usage of the various designs described above drastically lowers the magnitude of the current conducted from the analog input node of the selected channel to the sampling capacitor. Shown in FIGS. 15-16 are graphs showing the magnitude of the charge taken from the analog input node of the selected channel to the sampling capacitor, for different input voltages, and for the various designs. For example, as can be seen in FIG. 15, at an input voltage of 2.5 volts, without the above described designs, the magnitude of the charge from the analog input node would be 12.4 pC, but with the designs of FIGS. 2, 6, and 10, the magnitude of the charge from the analog input node is instead 553.6 fC, 3.43 pC, and 975.6 fC, respectively. As another example, as can be seen in FIG. 1, at an input voltage of 2.5 V, without the above described designs, the magnitude of the charge from the analog input node would be 12.4 pC, but with the designs of FIGS. 4, 8, and 12, the magnitude of the charge from the analog input node would be 370.7 fC, 1.109 pC, and 1.5 pC, respectively.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
   a plurality of analog input nodes;
   a plurality of switches selectively coupling each of the plurality of analog input nodes to a capacitive node, wherein each of the plurality of switches is controlled by a respective bit of a channel selection word;
   a plurality of level shifting circuits respectively coupled in parallel with the plurality of switches;
   a sampling capacitor coupled between an output node and ground, the output node being coupled to the capacitive node; and
   an analog to digital converter configured to digitize voltages at the output node.

2. The circuit of claim 1, wherein each level shifting circuit of the plurality of level shifting circuits is selectively configurable to charge or discharge the sampling capacitor to slightly above or slightly below, respectively, a voltage at its associated analog input node, such that when a given switch of the plurality of switches is closed, charge transferred from its respective analog input node to the sampling capacitor is modified.

3. The circuit of claim 1, wherein each level shifting circuit of the plurality of level shifting circuits comprises:
   a transmission gate coupled between first and second nodes, the transmission gate controlled by a first control signal;
   a first current sink coupled between the first node and ground and controlled by a voltage at the analog input node associated with that level shifting circuit;
   a second current sink coupled between the second node and ground and controlled by the first control signal;
   a first current source coupled between the first node and a supply voltage and controlled by a logical combination of the first control signal and a second control signal;
   a second current source coupled to the supply voltage and controlled by the first control signal;
   a third current source coupled to receive output from the second current source and controlled by the a voltage at the second node; and
   a third current sink coupled between the capacitive node and ground and controlled by the second control signal.

4. The circuit of claim 3, wherein the logical combination of the first and second control signals comprises a logical NOR operation between the second control signal and an inverse of the first control signal.

5. The circuit of claim 3, wherein
   the first current sink comprises a first p-channel transistor having a source coupled to the first node, a drain coupled to ground, and a gate coupled to the analog input node associated with that level shifting circuit;
   the second current sink comprises first n-channel transistor having a drain coupled to the second node, a source coupled to ground, and a gate coupled to the first control signal;
   the first current source comprises a second p-channel transistor having a source coupled to the supply voltage, a drain coupled to the first node through a resistor, and a gate coupled to receive the logical combination of the first control signal and the second control signal;
   the second current source comprises a third p-channel transistor having a source coupled to the supply voltage, a drain, and a gate coupled to the first control signal;
   the third current source comprises a second n-channel transistor having a drain coupled to the drain of the third p-channel transistor, a source coupled to the capacitive node, and a gate coupled to the second node; and the third current sink comprises a third n-channel transistor having a drain coupled to the capacitive node, a source coupled to ground, and a gate coupled to the second control signal.

6. The circuit of claim 1, wherein each level shifting circuit of the plurality of level shifting circuit comprises:
a transmission gate coupled between first and second nodes, the transmission gate controlled by a first control signal;
a first current source coupled between a supply voltage and the first node, the first current source controlled by a voltage at the analog input node associated with that level shifting circuit;
a second current source coupled between a supply voltage and the capacitive node, the second current source controlled by a second control signal;
a first current sink coupled between the first node and ground, the first current sink controlled by a logical combination of the first and second control signals;
a third current source coupled between the supply voltage and the second node, the third current source controlled by the first control signal;
a second current sink coupled to the capacitive node, the second current sink controlled by a voltage at the second node; and
a third current sink coupled between the second current sink and ground, the third current sink controlled by the first control signal.

7. The circuit of claim 6, wherein:
the first current source comprises a first n-channel transistor having a drain coupled to the supply voltage, a drain coupled to the first node, and a gate coupled to the voltage at the analog input node associated with that level shifting circuit;
the second current source comprises a first p-channel transistor having a source coupled to the supply voltage, a drain coupled to the capacitive node, and a source coupled to the second control signal;
the first current sink comprises a second n-channel transistor having a drain coupled to the first node through a resistor, a source coupled to ground, and a gate coupled to the logical combination of the first and second control signals;
the third current source comprises a second p-channel transistor having a source coupled to the supply voltage, a drain coupled to the second node, and a gate coupled to an inverse of the first control signal;
the second current sink comprises a third p-channel transistor having a source coupled to the capacitive node, a drain, and a gate coupled to the second node; and
the third current sink comprises a third n-channel transistor having a drain coupled to the drain of the third p-channel transistor, a source coupled to ground, and a gate coupled to an inverse of the first control signal.

8. The circuit of claim 6, wherein the logical combination of the first and second control signals comprises a logical NAND operation between the first and second control signals.

9. A circuit, comprising:
a plurality of analog input nodes;
a plurality of switches selectively coupling each analog input node of of the plurality of analog input nodes to a first node, each switch of the plurality of switches controlled by a respective bit of a channel selection word;
a switch selectively coupling the first node to a capacitive node, the switch controlled by a channel selection signal;
a level shifting circuit coupled to the capacitive node, a supply voltage, and ground, the level shifting circuit being controlled by a voltage at the first node, a first control signal, and a second control signal;
a sampling capacitor coupled between an output node and ground, the output node being coupled to the capacitive node; and
an analog to digital converter digitizing voltages on at the output node.

10. The circuit of claim 9, wherein the level shifting circuit comprises:
a current source coupled between the supply voltage and the capacitive node, the current source controlled by the voltage at the first node and the first control signal; and
a current sink coupled between the capacitive node and ground, the current sink controlled by the second control signal.

11. The circuit of claim 10, wherein:
the current source comprises:
a first p-channel transistor having a source coupled to the supply voltage, a drain, and a gate coupled to the first control signal; and
a first n-channel transistor having a drain coupled to the drain of the first p-channel transistor, a source coupled to the capacitive node, and a gate coupled to the first node; and
the current sink comprises a second n-channel transistor having a drain coupled to the capacitive node, a source coupled to ground, and a gate coupled to the second control signal.

12. The circuit of claim 9, wherein the level shifting circuit comprises:
a current source coupled between the supply voltage and the capacitive node, the current source controlled by the second control signal; and
a current sink coupled between the capacitive node and ground, the current sink controlled by the first control signal.

13. The circuit of claim 12, wherein:
the current source comprises a first p-channel transistor having a source coupled to the supply voltage, a drain coupled to the capacitive node, and a gate coupled to the second control signal; and
the current sink comprises:
a second p-channel transistor having a source coupled to the capacitive node, a drain, and a gate coupled to the first node; and
a first n-channel transistor having a drain coupled to the drain of the second p-channel transistor, a source coupled to ground, and a gate coupled to the first control signal.

14. The circuit of claim 9, wherein the level shifting circuit comprises:
a first current source coupled between the supply voltage and a second node, the first current source controlled by a logical combination of the first and second control signals;
a first current sink coupled between the first current source and ground, the first current sink controlled by the voltage at the first node;
a transmission gate between the second node and a third node, the transmission gate controlled by the first control signal;

a second current sink coupled between the third node and ground, the second current sink controlled by the first control signal;

a second current source coupled between the supply voltage and the capacitive node, the second current source controlled by a voltage at the third node and the first control signal; and a third current sink coupled between the capacitive node and ground, the third current sink controlled by the second control signal.

15. The circuit of claim 14, wherein:

the first current source comprises a first p-channel transistor having a source coupled to the supply voltage, a drain coupled to the second node through a transistor, and a gate coupled to the logical combination of the first and second control signals;

the first current sink comprises a second p-channel transistor having a source coupled to the second node, a drain coupled to ground, and a gate coupled to the first node;

the second current sink comprises a first n-channel transistor having a drain coupled to the third node, a source coupled to ground, and a gate coupled to the first control signal;

the second current source comprises:
 a third p-channel transistor having a source coupled to the supply voltage, a drain, and a gate coupled to the first control signal; and
 a second n-channel transistor having a drain coupled to the drain of the third p-channel transistor, a source coupled to the capacitive node, and a gate coupled to the third node; and the third current sink comprises a third n-channel transistor having a drain coupled to the capacitive node, a source coupled to ground, and a gate coupled to the second control signal.

16. The circuit of claim 14, wherein the logical combination of the first and second control signals comprises a local NOR operation on the second control signal and an inverse of the first control signal.

17. The circuit of claim 9, wherein the level shifting circuit comprises:

a first current source coupled between the supply voltage and the capacitive node, the first current source controlled by the second control signal;

a second current source coupled between the supply voltage and a second node, the second current source controlled by a voltage at the first node;

a first current sink coupled between the second node and ground, the first current sink controlled by a logical combination of the first and second control signals;

a transmission gate coupled between the second node and a third node, the transmission gate controlled by the first control signal;

a third current source coupled between the supply voltage and the third node, the third current source controlled by the first control signal; and a second current sink coupled between the capacitive node and ground, the second current sink controlled by a voltage at the third node and the first control signal.

18. The circuit of claim 17, wherein:

the first current source comprises a first p-channel transistor having a source coupled to the supply voltage, a drain coupled to the capacitive node, and a gate coupled to the second control signal;

the second current source comprises a first n-channel transistor having a drain coupled to the supply voltage, a source coupled to the second node, and a gate coupled to the first node;

the first current sink comprises a second n-channel transistor having a drain coupled to the second node through a resistor, a source coupled to ground, and a gate coupled to the logical combination of the first and second control signals;

the third current source comprises a second p-channel transistor having a source coupled to the supply voltage, a drain coupled to the third node, and a gate coupled to an inverse of the first control signal; and the second current sink comprises:
 a third p-channel transistor having a source coupled to the capacitive node, a drain, and a gate coupled to the third node; and
 a third n-channel transistor having a drain coupled to the drain of the third p-channel transistor, a source coupled to ground, and a gate coupled to the inverse of the first control signal.

19. The circuit of claim 17, wherein the logical combination of the first and second control signals is a logical NAND operation between the first and second control signals.

20. The circuit of claim 9, wherein the level shifting circuit is selectively configurable to charge or discharge the sampling capacitor to slightly above or below, respectively, a voltage at the first node.

* * * * *